United States Patent
Ishibashi

(10) Patent No.: US 11,424,138 B2
(45) Date of Patent: Aug. 23, 2022

(54) SUBSTRATE CLEANING TOOL, SUBSTRATE CLEANING APPARATUS, SUBSTRATE PROCESSING APPARATUS, SUBSTRATE PROCESSING METHOD, AND METHOD OF MANUFACTURING SUBSTRATE CLEANING TOOL

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 84 days.

(21) Appl. No.: 16/536,939

(22) Filed: Aug. 9, 2019

(65) Prior Publication Data
US 2020/0066549 A1 Feb. 27, 2020

(30) Foreign Application Priority Data

Aug. 9, 2018 (JP) .............................. JP2018-150053

(51) Int. Cl.
*H01L 21/67* (2006.01)
*B08B 3/08* (2006.01)
*H01L 21/02* (2006.01)
*H01L 21/687* (2006.01)

(52) U.S. Cl.
CPC ............ *H01L 21/6704* (2013.01); *B08B 3/08* (2013.01); *H01L 21/02087* (2013.01); *H01L 21/68764* (2013.01)

(58) Field of Classification Search
CPC .................... H01L 21/67046; H01L 21/67092
See application file for complete search history.

(56) References Cited

U.S. PATENT DOCUMENTS

| 6,079,073 A * | 6/2000 | Maekawa ............... B08B 1/007 15/102 |
| 2002/0173259 A1 | 11/2002 | Drury |
| 2005/0000652 A1 | 1/2005 | Nam et al. |
| 2007/0224811 A1 | 9/2007 | Wang et al. |
| 2008/0182488 A1 | 7/2008 | Frost et al. |
| 2011/0209727 A1 | 9/2011 | Wang et al. |
| 2014/0366913 A1* | 12/2014 | Cho ..................... A46B 13/001 134/6 |
| 2017/0316959 A1 | 11/2017 | Ishibashi |
| 2018/0126422 A1 | 5/2018 | Ishibashi |

FOREIGN PATENT DOCUMENTS

| EP | 2051289 A1 | 4/2009 |
| JP | H11-283952 A | 10/1999 |
| JP | 2007051234 A * | 3/2007 |

(Continued)

OTHER PUBLICATIONS

Machine translation: JP2011104717 (Year: 2011).*

(Continued)

*Primary Examiner* — Natasha N Campbell
(74) *Attorney, Agent, or Firm* — BakerHostetler

(57) ABSTRACT

A substrate cleaning apparatus comprises a substrate holding roller and an edge cleaner. The substrate holding roller is configured to hold and rotate a substrate to be processed. The edge cleaner is in contact with an edge portion of the substrate to be processed and includes resin material containing fluororesin particles at least in a portion in contact with the substrate to be processed.

8 Claims, 12 Drawing Sheets

(56) References Cited

FOREIGN PATENT DOCUMENTS

| | | | |
|---|---|---|---|
| JP | 2011104717 A | * | 6/2011 |
| JP | 2011-181644 A | | 9/2011 |
| JP | 5472344 B2 | * | 4/2014 |
| JP | 2017-191827 A | | 10/2017 |
| WO | WO 2016/067563 A1 | | 5/2016 |

OTHER PUBLICATIONS

Machine translation: JP5472344 (Year: 2014).*
Abstract: JP2007-051234 (Year: 2007).*
European Patent Application No. 19190837.5; Extended Search Report; dated Jan. 3, 2020; 9 pages.

* cited by examiner

A-A CROSS SECTION

38

38

38

38

RAW MATERIAL LIQUID   ABRASIVE GRAINS   MOLD

SUBSTRATE CLEANING TOOL, SUBSTRATE CLEANING APPARATUS, SUBSTRATE PROCESSING APPARATUS, SUBSTRATE PROCESSING METHOD, AND METHOD OF MANUFACTURING SUBSTRATE CLEANING TOOL

CROSS REFERENCE TO RELATED APPLICATIONS

This application claims the benefit of Japanese Priority Patent Application JP 2018-150053 filed on Aug. 9, 2018, the entire contents of which are incorporated herein by reference.

FIELD

The present invention relates to a substrate cleaning tool, a substrate cleaning apparatus, a substrate processing apparatus, and a substrate processing method for cleaning a substrate, and a method of manufacturing a substrate cleaning tool.

BACKGROUND

Conventionally, a substrate cleaning tool using a PVA sponge has been known. However, conventional substrate cleaning tools do not necessarily have sufficient cleaning power.

The present invention provides a substrate cleaning tool with high cleaning power, a substrate cleaning apparatus and a substrate processing apparatus which include such a substrate cleaning tool, a substrate processing method using such a substrate cleaning tool, and a method of manufacturing such a substrate cleaning tool.

SUMMARY

According to an aspect of the present invention, a substrate cleaning tool comprises a resin material where at least a portion in contact with a substrate to be processed contains fluororesin particles.

The substrate cleaning tool may further comprises at least a first region of the portion in contact with the substrate to be processed and a second region of the portion in contact with the substrate to be processed, and a distribution density of the fluororesin particles may vary between the first region and the second region.

The fluororesin particles may contained in a surface of the substrate cleaning tool.

The fluororesin particles may be a conductive resin.

The fluororesin particles may be a resin containing carbon nanotubes.

According to another aspect of the present invention, a substrate cleaning tool comprises a resin material where at least a portion in contact with a substrate to be processed contains catalyst metal particles.

The substrate cleaning tool may further comprises at least a first region of the portion in contact with the substrate to be processed and a second region of the portion in contact with the substrate to be processed, and a distribution density of the catalyst metal particles may vary between the first region and the second region.

The catalyst metal particles may be contained in a surface of the substrate cleaning tool.

According to another aspect of the present invention, a substrate cleaning apparatus comprises a holding rotating mechanism configured to hold and rotate a substrate to be processed and the substrate cleaning tool configured to come into contact with the substrate to be processed and clean the substrate.

The substrate cleaning tool may clean a bevel or a back surface of the rotated substrate to be processed.

According to another aspect of the present invention, a substrate processing apparatus comprises a substrate polishing apparatus configured to hold a substrate to be processed by a top ring and polish the substrate to be processed by using slurry, and the substrate cleaning apparatus configured to clean the substrate to be processed that has been polished by the substrate polishing apparatus.

According to another aspect of the present invention, a method of manufacturing a substrate cleaning tool comprising a first step of attaching fluororesin particles, catalyst metal particles, or abrasive grains to an inner surface of a mold of a substrate processing tool, a second step of putting a raw material liquid of PVA sponge into the mold after the first step, and a third step of reacting the raw material liquid of PVA sponge in the mold.

It may be possible that, in the second step, the raw material liquid of PVA sponge containing fluororesin particles, catalyst metal particles, or abrasive grains is put into the mold.

The method of manufacturing a substrate cleaning tool may comprise a fourth step of removing a skin layer of a molded PVA sponge.

According to another aspect of the present invention, a substrate processing method comprising a polishing step of holding a substrate to be processed by a top ring and polishing the substrate to be processed by using slurry, and a cleaning step of cleaning the substrate to be processed, which has been polished, by the substrate cleaning tool.

It may be possible that, in the cleaning step, the substrate to be processed is cleaned by a first portion of the substrate cleaning tool, and thereafter, the substrate to be processed is cleaned by a second portion located above the first portion of the substrate cleaning tool.

According to another aspect of the present invention, a substrate cleaning apparatus comprises a substrate holding roller configured to hold and rotate a substrate to be processed, and an edge cleaner that is in contact with an edge portion of the substrate to be processed and includes resin material containing fluororesin particles at least in a portion in contact with the substrate to be processed.

The substrate cleaning apparatus may further comprises a controller configured to control the substrate holding roller and the edge cleaner so that, while the substrate to be processed is cleaned, the substrate holding roller holds the substrate to be processed and the edge cleaner is in contact with the substrate to be processed.

DETAILED DESCRIPTION

Hereinafter, embodiments will be described with reference to the drawings.

As an example, a substrate cleaning tool according to the present invention can be applied to a substrate cleaning apparatus that cleans a substrate (including a semiconductor substrate, a hard disk, a reticle, a flat panel, a sensor, and the like) after being polished by a substrate polishing apparatus in a chemical mechanical polishing apparatus (also referred to as a CMP apparatus or a substrate processing apparatus). In the substrate polishing apparatus of the CMP apparatus, particles are firmly fixed to a back surface of the substrate in order to hold the back surface of the substrate by a resin member of a top ring. Further, in the substrate polishing apparatus of the CMP apparatus, the substrate is held by the top ring in a state where the periphery of the substrate is surrounded by a retainer ring, and slurry (polishing liquid), which enters between the substrate and the retainer ring, is attached to the periphery of the substrate in order to polish the substrate by using the slurry. Therefore, high cleaning power is required for the substrate cleaning tool in the substrate cleaning apparatus, and in particular, it is desirable that the back surface and the periphery of the substrate can be cleaned. First, the substrate cleaning apparatus will be described.

Figure 10:
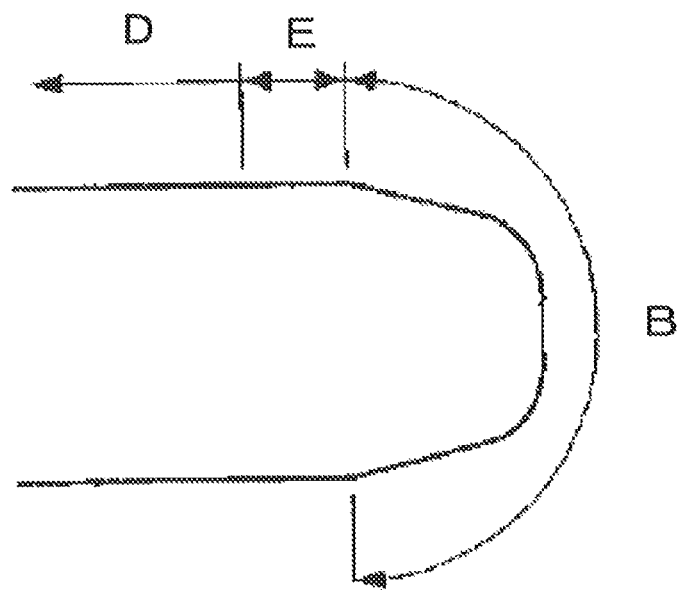
FIG. 10 is a diagram for explaining a bevel and an edge.

As the substrate to be processed in the present invention, a circular substrate and a rectangular substrate can be used. The substrate may also be a multi-layered substrate having a metal feature or may be a substrate in which various oxide films having different film qualities are formed. In the present specification, as shown in FIG. 10, in a substrate end portion, a portion B whose cross-section has a curvature is called a "bevel", and a region E closer to the bevel than a region D where a device is formed is called an "edge". The bevel and the edge are collectively called a "peripheral portion".

Figure 1:
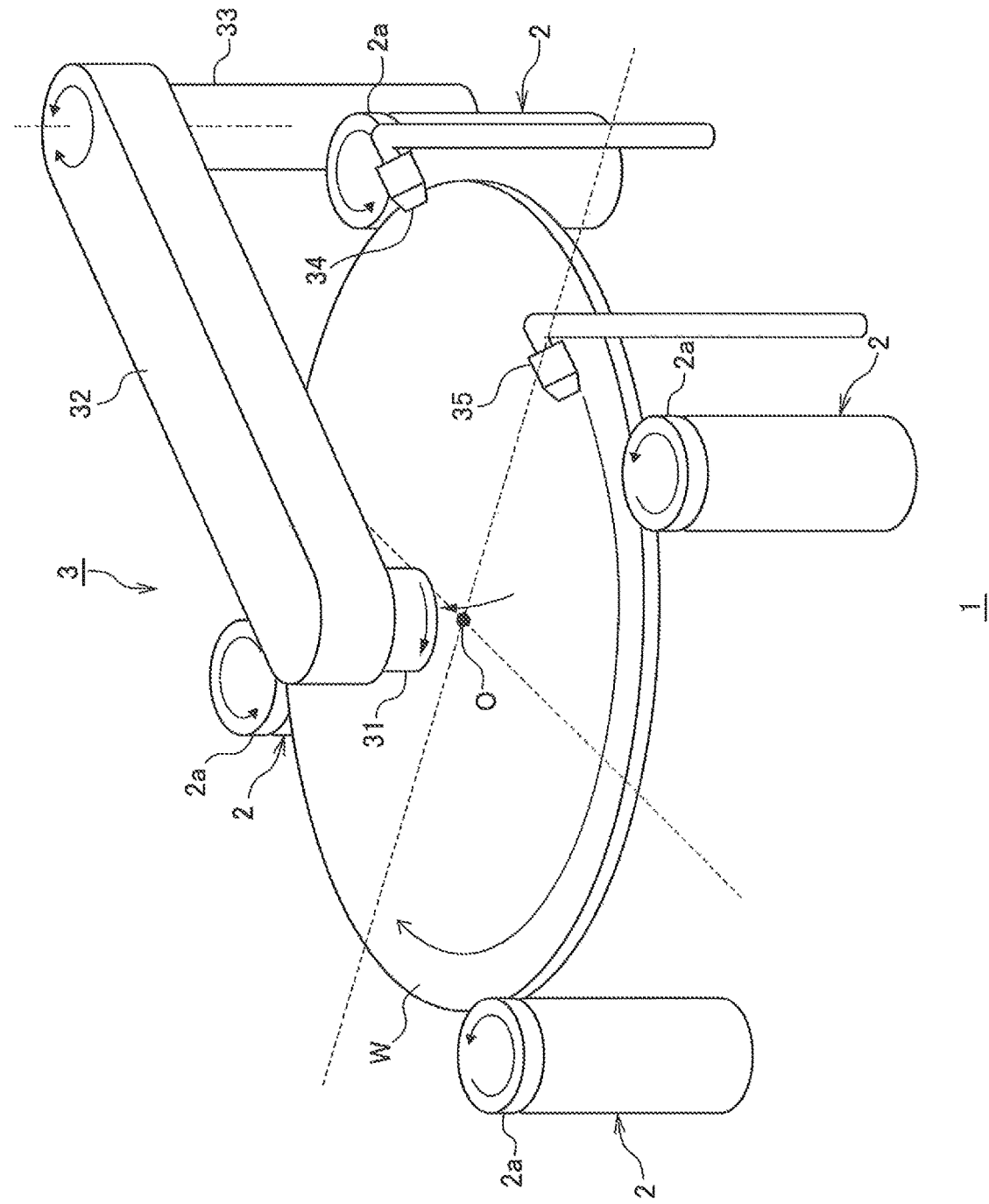
FIG. 1 is a perspective view showing a schematic configuration of a substrate cleaning apparatus.

FIG. 1 is a perspective view showing a schematic configuration of a substrate cleaning apparatus 1. The substrate cleaning apparatus 1 includes spindles 2 and a cleaning mechanism 3.

The spindles 2 are an example of a substrate holding rotating mechanism. The spindles 2 hold a peripheral portion of a substrate W with its surface facing up and rotate the substrate W in a horizontal plane. More specifically, the substrate W is rotated by positioning the peripheral portion of the substrate W in a holding groove formed on an outer circumferential side surface of a piece 2a provided in an upper portion of the spindle 2, inwardly pressing the peripheral portion of the substrate W, and rotating (auto-rotating) the piece 2a. Here, the "piece 2a" can be paraphrased to a "holding portion" for holding the substrate. The "spindle 2" can be paraphrased to a "roller".

The cleaning mechanism 3 has a pen type cleaning tool 31, which is an example of the substrate cleaning tool according to the present invention, an arm 32 that supports the pen type cleaning tool 31, a moving mechanism 33 that moves the arm 32, a cleaning liquid nozzle 34, and a rinse liquid nozzle 35.

The pen type cleaning tool 31 has, for example, a columnar shape and is arranged above the substrate W supported by the spindles 2 so that an axis line is perpendicular to the substrate W. A lower surface of the pen type cleaning tool 31 cleans an upper surface of the substrate W, and an upper surface of the pen type cleaning tool 31 is supported by the arm 32.

The arm 32 is a flat bar-shaped member and is typically arranged so that the longitudinal direction of the arm 32 is in parallel with the substrate W. One end of the arm 32 rotatably supports the pen type cleaning tool 31 around the axis line of the pen type cleaning tool 31, and the other end is connected with the moving mechanism 33.

The moving mechanism 33 moves the arm 32 up and down in the vertical direction and swings the arm 32 in the horizontal plane. The arm 32 is swung in the horizontal direction by the moving mechanism 33 so that a trajectory of the pen type cleaning tool 31 draws an arc around the other end of the arm 32.

The cleaning liquid nozzle 34 supplies a cleaning liquid such as chemical liquid or pure water when cleaning the substrate W by the pen type cleaning tool 31. The rinse liquid nozzle 35 supplies a rinse liquid such as pure water to the substrate W.

In the cleaning mechanism 3 described above, in a state where the substrate W is rotated, while the cleaning liquid is supplied onto the substrate W from the cleaning liquid nozzle 34, the lower surface of the pen type cleaning tool 31 comes into contact with a surface WA of the substrate W and the arm 32 is swung, so that the substrate W is physically cleaned in contact mode.

Figure 2:
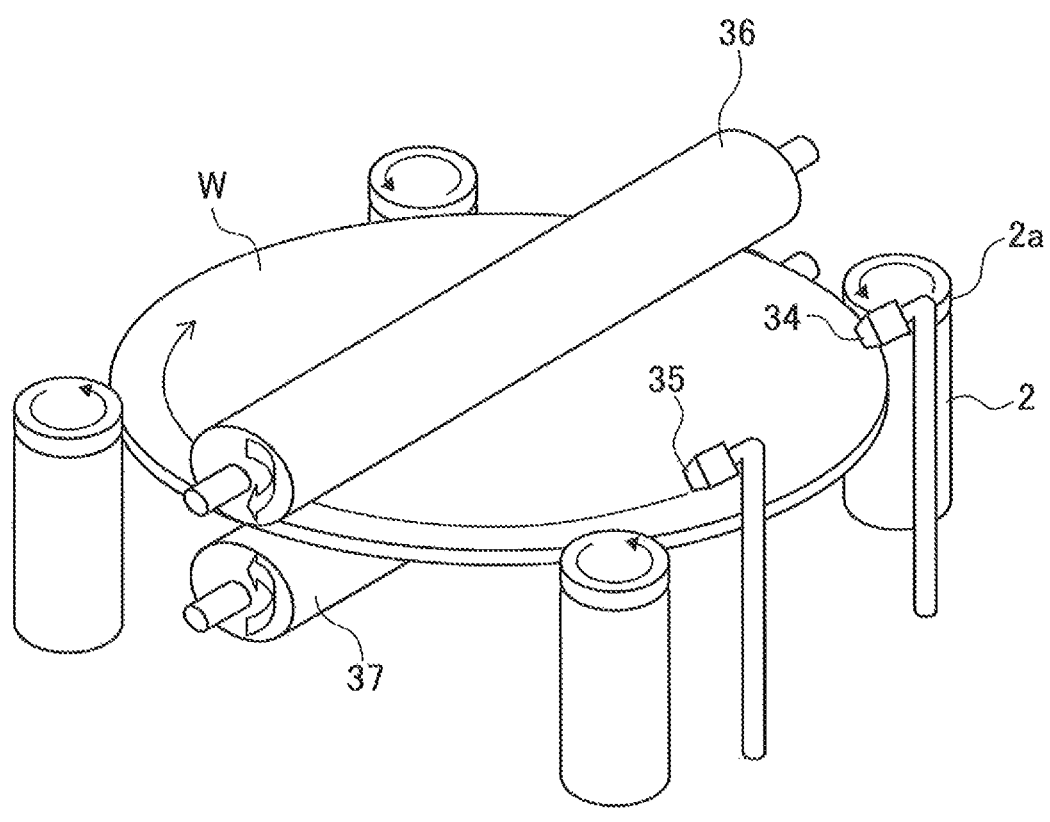
FIG. 2 is a perspective view showing a schematic configuration of another substrate cleaning apparatus.

FIG. 2 is a perspective view showing a schematic configuration of another substrate cleaning apparatus 1a. Hereinafter, differences from FIG. 1 will be mainly described.

The substrate cleaning apparatus 1a includes a roll type cleaning tool 36, which is an example of the substrate cleaning tool according to the present invention, and a roll type cleaning tool 37 arranged immediately below the roll type cleaning tool 36. The roll type cleaning tools 36 and 37 have a long shape and are desirable to extend from an edge of the substrate W to the opposite edge and pass through the center of the substrate W.

In a state where the substrate W is rotated, while the cleaning liquid is supplied onto the substrate W from the cleaning liquid nozzle 34, the roll type cleaning tools 36 and 37 come into contact with the upper surface and the lower surface of the substrate W, respectively, and rotate, so that the upper surface and the lower surface of the substrate W are physically cleaned in contact mode. Typically, the upper surface of the substrate W is a device surface where a device pattern is formed and the lower surface of the substrate W is a non-device surface where the device pattern is not formed. The non-device surface can be paraphrased to aback surface. In FIG. 2, the roll type cleaning tool 36 in contact with a front surface of the substrate may be a normal PVA sponge (containing no particles), and the roll type cleaning tool 37 in contact with a back surface of the substrate may be a substrate cleaning tool of the present invention.

Figure 3:
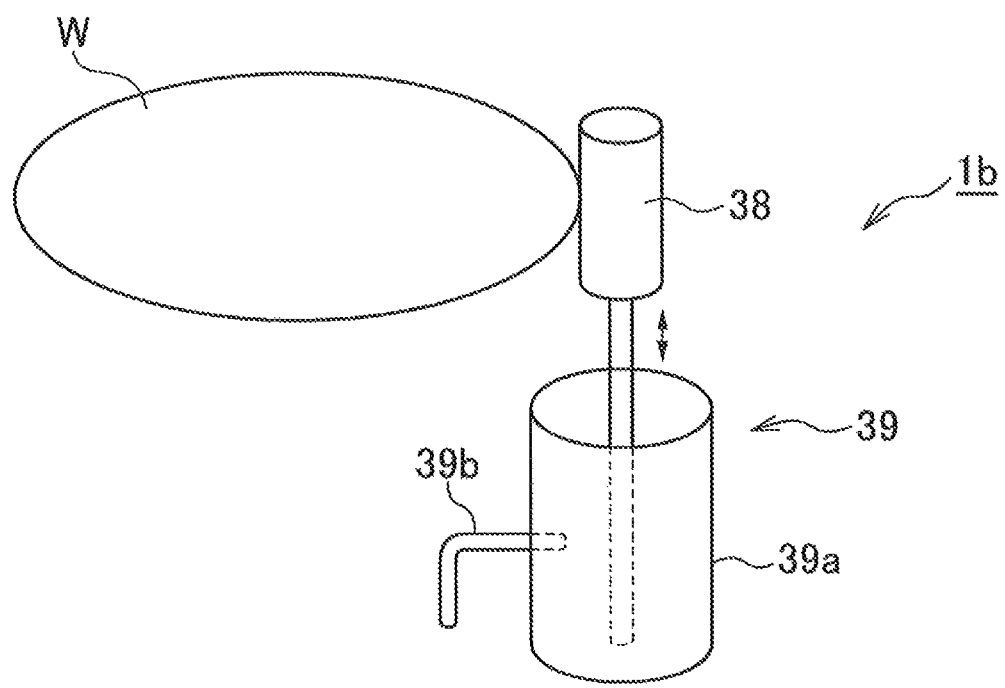
FIG. 3 is a perspective view showing a schematic configuration of yet another substrate cleaning apparatus.

FIG. 3 is a perspective view showing a schematic configuration of yet another substrate cleaning apparatus 1b. The substrate cleaning apparatus 1b cleans the bevel of the substrate W. The substrate cleaning apparatus 1b includes a bevel cleaning tool 38, which is an example of the substrate cleaning tool according to the present invention. In the same manner as in FIGS. 1 and 2, the substrate cleaning apparatus 1b includes a spindle and a cleaning liquid nozzle, which are not shown in the drawings.

The bevel cleaning tool 38 has a cylindrical shape or a columnar shape and is arranged so as to extend in the vertical direction (a direction perpendicular to the substrate W to be rotated). The bevel cleaning tool 38 is moved up and down by a cylinder or the like not shown in the drawings.

In a state where the substrate W is rotated, while the cleaning liquid is supplied onto the substrate W from the cleaning liquid nozzle, a side surface of the bevel cleaning tool 38 comes into contact with the bevel of the substrate W and rotates. It is desirable that the bevel cleaning tool 38 has an appropriate flexibility and when the side surface of the bevel cleaning tool 38 comes into contact with the substrate W from the side direction of the substrate W, the bevel cleaning tool 38 is deformed and the bevel cleaning tool 38 comes into contact with not only a side end portion of the substrate W, but also a portion inclined with respect to the surface of the substrate W (an inclined surface of the bevel). Thus, the bevel of the substrate W is physically cleaned in contact mode.

Figure 3A:
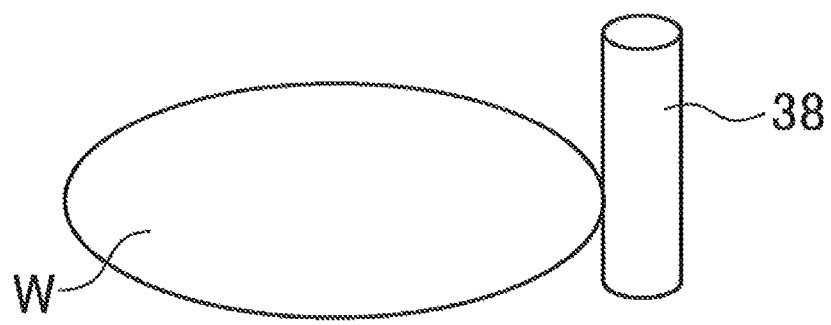
FIG. 3A is a diagram schematically showing a state of a substrate being cleaned by the substrate cleaning apparatus of FIG. 3.
Figure 3B:
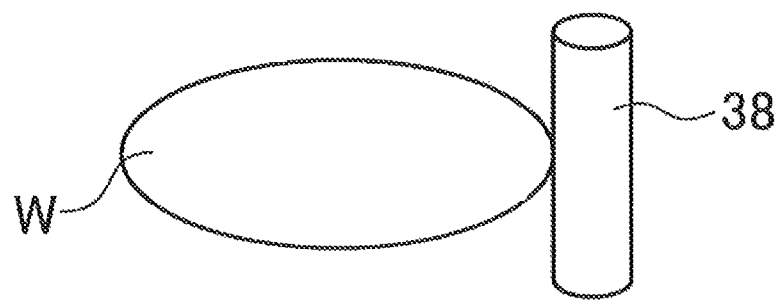
FIG. 3B is a diagram schematically showing a state of the substrate being cleaned by the substrate cleaning apparatus following FIG. 3A.
Figure 3C:
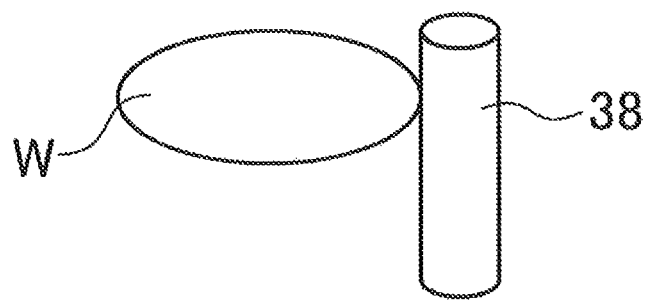
FIG. 3C is a diagram schematically showing a state of the substrate being cleaned by the substrate cleaning apparatus following FIG. 3B.

It is desirable that a lower portion of the bevel cleaning tool 38 comes into contact with the substrate W in a stage of initial cleaning of the substrate W (FIG. 3A), a central portion of the bevel cleaning tool 38 comes into contact with the substrate W in a stage following the initial cleaning of the substrate W (FIG. 3B), and an upper portion of the bevel cleaning tool 38 comes into contact with the substrate W in a final stage (FIG. 3C). Dirt attached to the bevel cleaning tool 38 moves downward. By use of the upper portion of the bevel cleaning tool 38 in the later stage of cleaning, it is possible to inhibit the dirt attached to the bevel cleaning tool 38 from attaching to the bevel again. Further, the entire bevel cleaning tool 38 from the uppermost to the lowermost is evenly attached to the substrate W, the life of the bevel cleaning tool 38 can be extended.

As shown in FIG. 3, the substrate cleaning apparatus 1b may have a cleaning tool cleaning mechanism 39. The bevel cleaning tool 38 lowers to the inside of the cleaning cup 39a and a cleaning liquid (such as chemical liquid or pure water) is sprayed from a nozzle 39b to the bevel cleaning tool 38 in the cleaning cup 39a, so that the bevel cleaning tool 38 is cleaned.

Figure 3D:
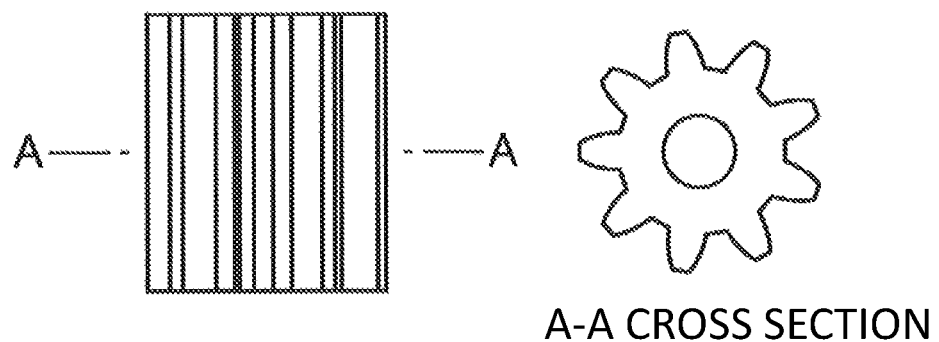
FIG. 3D is a front view and a cross-sectional view schematically showing an example of a surface structure of a bevel cleaning tool.
Figure 3E:
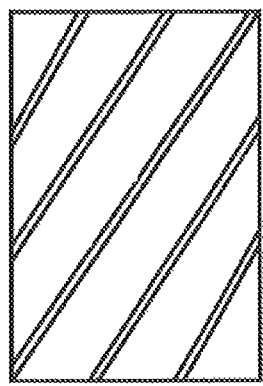
FIG. 3E is a front view schematically showing an example of the surface structure of the bevel cleaning tool.
Figure 3F:
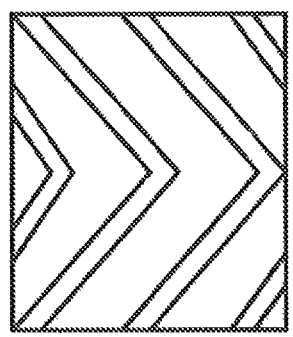
FIG. 3F is a front view schematically showing an example of the surface structure of the bevel cleaning tool.
Figure 3G:
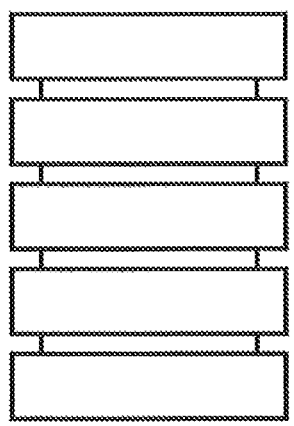
FIG. 3G is a front view schematically showing an example of the surface structure of the bevel cleaning tool.

Various surface structures of the bevel cleaning tool 38 can be considered. For example, as shown in FIG. 3D, concave and convex portions extending in the longitudinal direction of the bevel cleaning tool 38 may be formed. Alternatively, as shown in FIG. 3E, concave and convex portions inclined in a predetermined direction with respect to the longitudinal direction of the bevel cleaning tool 38 may be formed. Further, as shown in FIG. 3F, concave and convex portions which are inclined in a predetermined direction with respect to the longitudinal direction in a part (for example, an upper half) of the bevel cleaning tool 38 and which are inclined in a different direction with respect to the longitudinal direction (for example, a direction orthogonal to the predetermined direction) in the other part of the bevel cleaning tool 38 may be formed. Furthermore, as shown in FIG. 3G, large diameter portions and small diameter portions are alternately stacked to form concave and convex portions in a circumferential direction. When the bevel cleaning tool 38 shown in FIG. 3G is used, the periphery of the substrate W may be inserted in the small diameter portion.

The bevel cleaning tool 38 of the substrate cleaning apparatus 1b may be used along with the pen type cleaning tool 31 of the substrate cleaning apparatus 1 or the roll type cleaning tool 36 of the substrate cleaning apparatus 1a.

Figure 4A:
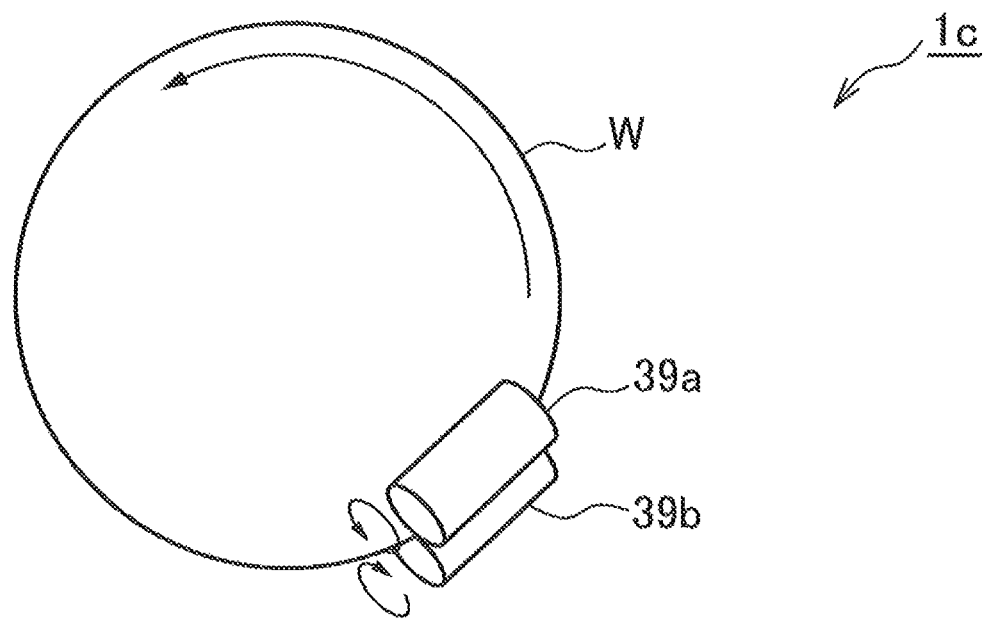
FIG. 4A is a top view showing a schematic configuration of yet another substrate cleaning apparatus.
Figure 4B:
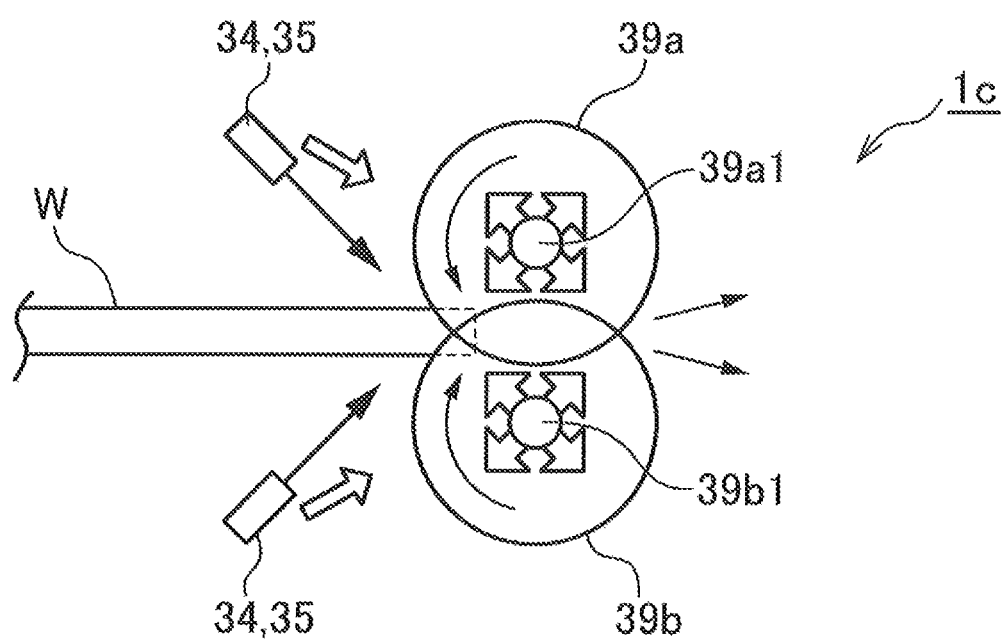
FIG. 4B is a side view showing a schematic configuration of the substrate cleaning apparatus.

FIGS. 4A and 4B are respectively a top view and a side view showing a schematic configuration of yet another substrate cleaning apparatus 1c. The substrate cleaning apparatus 1c cleans the bevel and the edge of the substrate W. The substrate cleaning apparatus 1c includes a roll type cleaning tool 39a and a roll type cleaning tool 39b arranged immediately below the roll type cleaning tool 39a. In the same manner as in FIGS. 1 and 2, the substrate cleaning apparatus 1c includes a spindle, which is not shown in the drawings.

When cleaning the substrate, the cleaning tool 39a is arranged so as to be in contact with the bevel and the edge of the upper surface of the substrate W and the substrate side surface. The cleaning tool 39b is arranged so as to be in contact with the bevel and the edge of the lower surface of the substrate W and the substrate side surface.

Figure 4C:
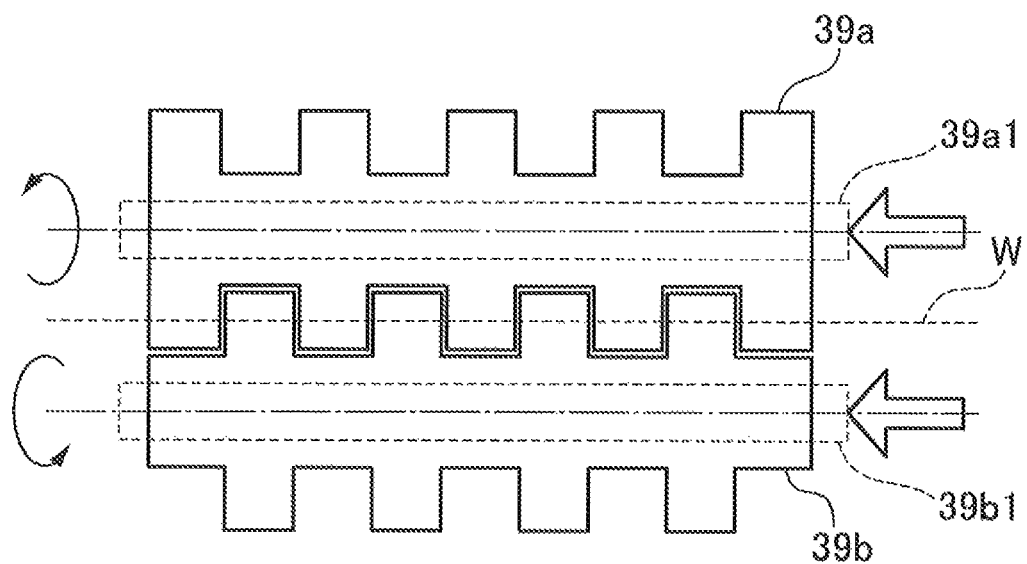
FIG. 4C is an enlarged diagram of a portion where a substrate W and cleaning tools are in contact with each other.

FIG. 4C is an enlarged diagram of a portion where the substrate W and the cleaning tools 39a and 39b are in contact with each other. As shown in FIG. 4C, in the cleaning tools 39a and 39b, large diameter portions and small diameter portions are alternately stacked in the same manner as in FIG. 3G. The large diameter portions of the cleaning tool 39a and the small diameter portions of the cleaning tool 39b are arranged to be engaged with each other but not to interfere with each other (not to be in contact with each other), so as to prevent dust caused by contact between the cleaning tools. The bevel and the edge of the substrate W and the substrate side surface are inserted between the cleaning tools 39a and 39b. According to such a configuration, a large number of corner portions of the cleaning tools 39a and 39b come into contact with the substrate W and further the substrate W is rotated, so that particle removal performance improves. In FIG. 4C, the large diameter portions and the small diameter portions have rectangular shapes, but the large diameter portions and the small diameter portions may have trapezoidal shapes.

The particle removal performance is improved by swinging the cleaning tools 39a and 39b. For example, the cleaning tools 39a and 39b may be slightly swung with respect to the radial direction of the substrate W, or may be swung in a tangential direction of the substrate W (rotation center line directions of the cleaning tools 39a and 39b).

When performing cleaning by supplying chemical liquid or ultrapure water, the cleaning liquid nozzle 34 and the rinse liquid nozzle 35 supply the cleaning liquid and the rinse liquid in a direction facing the edge of the substrate W, that is, a direction in which the cleaning liquid and the rinse liquid are caught by the rotations of the cleaning tools 39a and 39b. The cleaning tools 39a and 39b rotate in a direction in which the cleaning liquid and the rinse liquid supplied to the substrate W are discharged to the outside of the substrate W, in other words, the cleaning tools 39a and 39b rotate so that the rotation direction at a position where the cleaning tools 39a and 39b are in contact with the substrate W corresponds to a supply direction of the cleaning liquid. Thereby, particle discharge performance is also improved.

The cleaning liquid nozzle 34 and the rinse liquid nozzle 35 may supply the cleaning liquid and the rinse liquid to a portion where the substrate W and the cleaning tools 39a and 39b are in contact with each other (cross each other) or a vicinity of the contact portion instead of portions on the substrate W. Alternatively, the cleaning liquid may be supplied to two or more of the portion on the substrate W, the contact portion, and the vicinity of the contact portion. Anyway, there is no change in the direction in which the cleaning liquid and the rinse liquid supplied to the substrate Ware discharged to the outside of the substrate W.

As shown in FIG. 4B and FIG. 4C, the cleaning tools 39a and 39b may have rotating mechanisms and cores 39a1 and 39b1 to be rotation axes, and the cleaning liquid may be supplied to the inside of the cores 39a1 and 39b1 (so-called "inner rinse"). The supplied cleaning liquid are moved from the inside of the cores 39a1 and 39b1 to the surfaces (cleaning surfaces) of the cleaning tools 39a and 39b by centrifugal forces of the rotations of the cleaning tools 39a and 39b, and supplied to the substrate W. The external supply from the cleaning liquid nozzle 34 and the rinse liquid nozzle 35 described above may be combined with the inner rinse. The cleaning tools 39a and 39b may be combined or integrated with the cores 39a1 and 39b1 in advance before being used in the substrate cleaning apparatus 1c. Alternatively, the cleaning tools 39a and 39b may have only holes to which the cores 39a1 and 39b1 are inserted, and the cores 39a1 and 39b1 included in the substrate cleaning apparatus 1c may be inserted into the holes and used.

The substrate cleaning apparatuses 1, 1a, and 1b illustrated above are configured to clean the front surface, the back surface, and the bevel of the substrate by mainly the substrate cleaning tool. However, the cleaning tool according to the present invention can also be applied to buff-cleaning. The present invention assumes rough cleaning and bevel cleaning immediately after polishing in a CMP apparatus. However, the present invention can be applied not only to the cleaning after the polishing in the CMP apparatus, but also to a partial polishing process that partially additionally polishes a surface of a substrate (including a polishing process by a CARE method described later). Further, the present invention can be applied not only to the cleaning after substrate polishing, but also to a cleaning apparatus after plating. An object to be cleaned is not particularly limited. Besides the illustrated substrate, a member such as a spindle that holds an object to be cleaned may be an object to be cleaned.

First Embodiment

A substrate cleaning tool according to the first embodiment is a substrate cleaning tool (an abrasive grain containing PVA cleaning tool) made of PVA (polyvinyl alcohol) sponge where at least a portion that comes into contact with a substrate to be processed contains abrasive grains. The inside of the substrate cleaning tool is spongy. There may be a skin layer on a surface of the substrate cleaning tool, or the skin layer may be removed.

Figure 5:
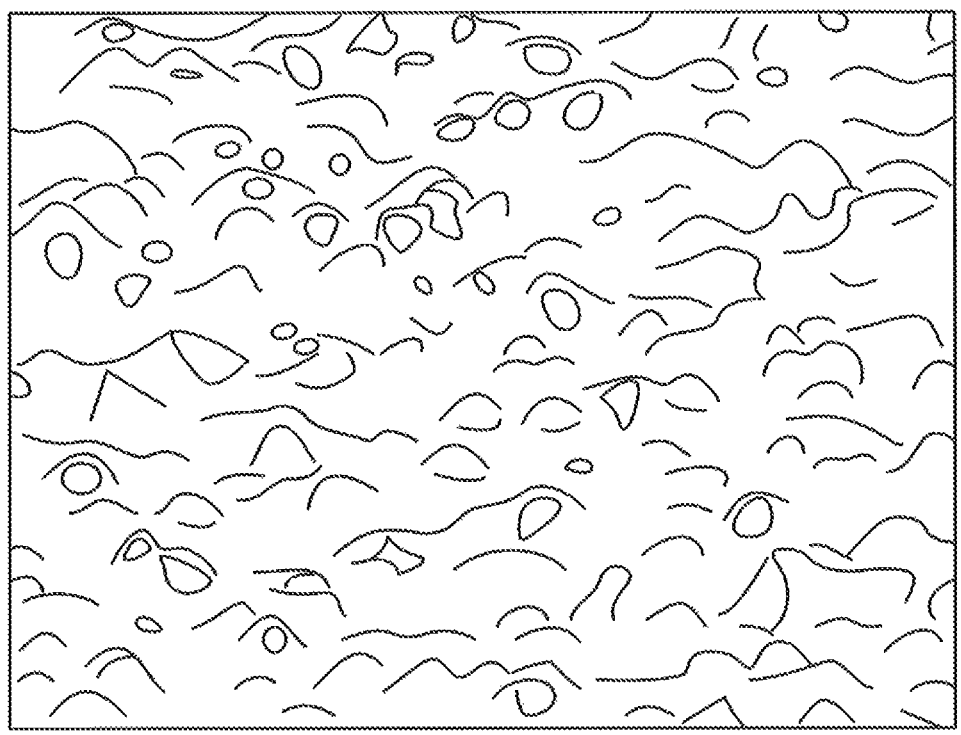
FIG. 5 is a view schematically showing a surface of a substrate cleaning tool whose surface contains abrasive grains.

Here, the abrasive grains may be silicon oxide, alumina, cerium oxide, or the like, and also may be other substances that can be used as abrasive grains in substrate polishing slurry. Alternatively, the abrasive grains may be diamond. The average particle diameter of the abrasive grains is 500 nm or less, and is desired to be several tens nm or less. When the average particle diameter of the abrasive grains is greater than 500 nm, polishing traces (scratches) tend to remain on the substrate. The abrasive grains may be included in the surface (skin layer) of the substrate cleaning tool (the surface of such a substrate cleaning tool is schematically shown in FIG. 5). The abrasive grains may be included inside the substrate cleaning tool. The abrasive grains may be included in both the surface and the inside.

The substrate cleaning tool according to the present embodiment is a PVA sponge where abrasive grains are mixed. Therefore, the substrate cleaning tool has high water-absorbing property and water-holding property and exhibits excellent flexibility when being wet, so that the substrate cleaning tool is suitable as a carrier including abrasive grains. Such PVA sponge includes abrasive grains whose diameters are 500 nm or less. According to the substrate cleaning tool containing such abrasive grains, a mechanical removal force improves and a damage applied to the object to be cleaned can be suppressed.

Figure 6:
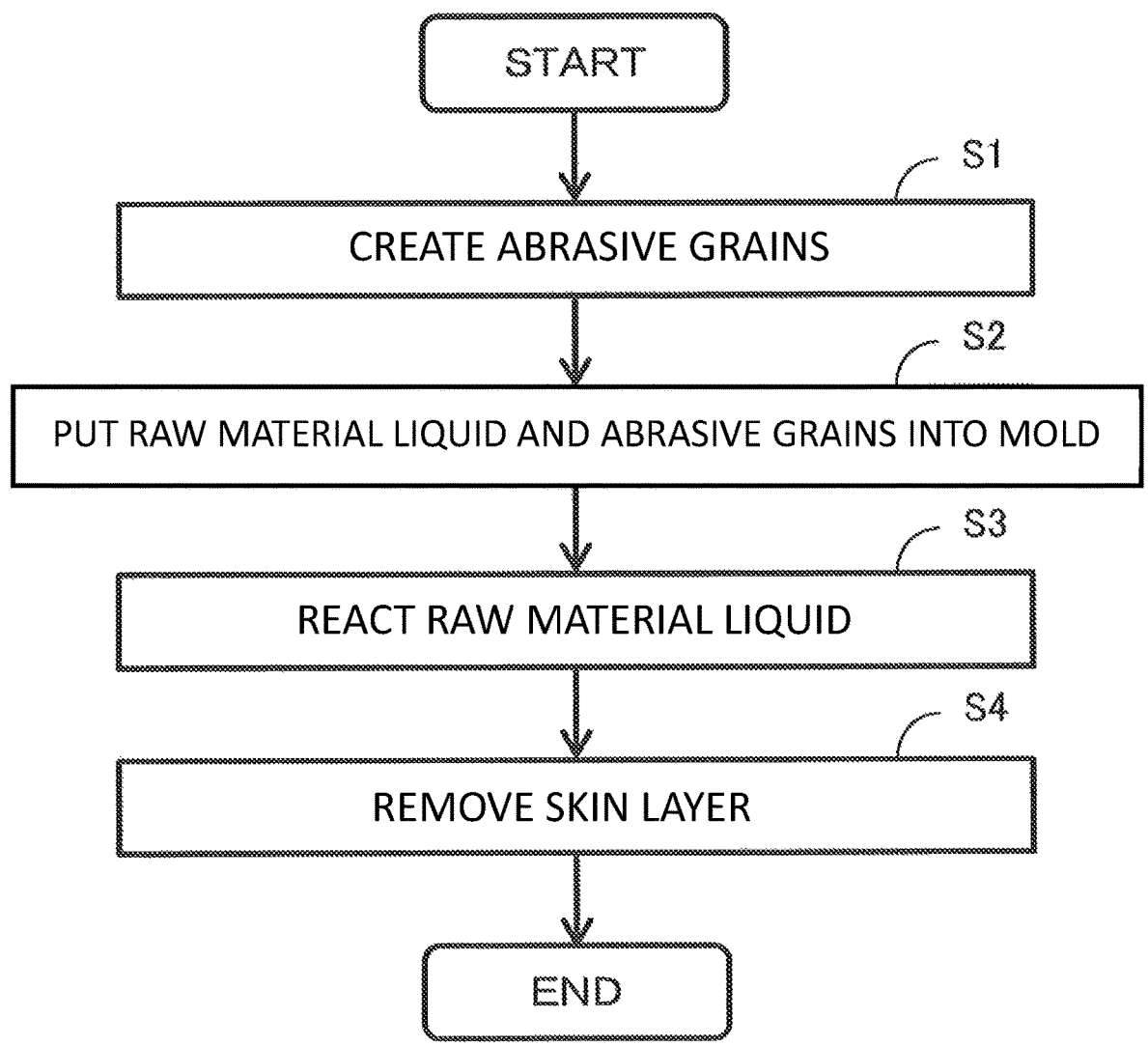
FIG. 6 is a manufacturing flowchart of a substrate cleaning tool containing fine abrasive grains therein.

FIG. 6 is a manufacturing flowchart of the substrate cleaning tool containing abrasive grains therein.

First, the abrasive grains and a raw material liquid are prepared. The abrasive grains can be prepared by a known method. In order to obtain abrasive grains whose diameters are small, fine abrasive grains may be created by causing large abrasive grains to be hit together and crushed by a known method (step S1).

Figure 7:
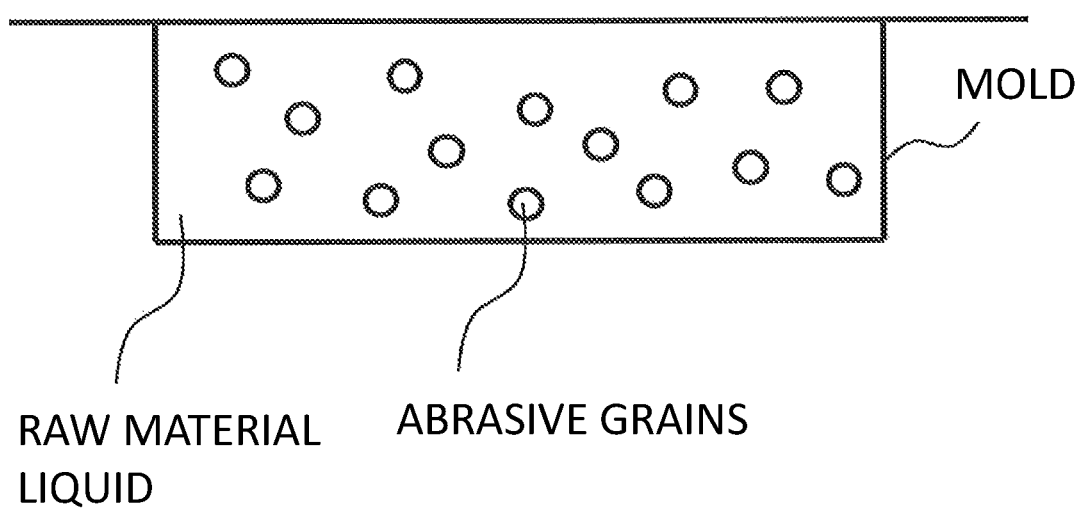
FIG. 7 is a view schematically showing a state where raw material liquid of PVA sponge and fine abrasive grains are put into a mold.

Next, a mixture of a raw material liquid of PVA sponge where an acetalizing agent (for example, aldehydes such as formaldehyde), a reaction catalyst (for example, mineral acid such as sulfuric acid or hydrochloric acid), and a pore making agent (for example, starch) are blended into a PVA solution and the created fine abrasive grains is put into a mold (step S2, see FIG. 7). The abrasive grains may be put into the mold after the raw material liquid is put into the mold.

At this time, by uniformly putting abrasive grains into the mold, it is possible to manufacture a substrate cleaning tool where distribution density of the abrasive grains is uniform. Alternatively, by putting a large amount of abrasive grains into a part of the mold (for example, a central part of the mold) and putting a small amount of abrasive grains into another part of the mold (for example, a part away from the central part of the mold), it is possible to manufacture a substrate cleaning tool where distribution density of the abrasive grains varies depending on position.

Thereafter, the raw material liquid is reacted at 40 to 100° C. for 5 to 20 hours in the mold (step S3). In this case, the raw material liquid may be reacted while the mold is rotated. After the reaction, redundant acetalizing agent, reaction catalyst, and pore making agent are cleaned and removed.

Here, a skin layer is formed on a surface of the PVA sponge molded in step S3. The skin layer is a coating film layer which is formed on a contact surface between the PVA sponge and the mold when the PVA sponge is molded in the mold. The skin layer may be removed (step S4). Whether or not to remove the skin layer can be appropriately selected. For example, when removal of large foreign objects and/or longevity of the substrate cleaning tool are intended, the skin layer should be left as it is. On the other hand, when removal of small foreign objects and/or prevention of reverse contamination from the substrate cleaning tool are intended, the skin layer should be removed.

The skin layer contains a large amount of particles, and when the skin layer is not removed, the particles contribute to the cleaning. Even when the skin layer is removed, many particles exist in an exposed sponge portion (as compared with inside), so that even when the skin layer is removed, the cleaning power is higher than that when particles are not attached to an inner surface of the mold in advance.

Thereby, it is possible to manufacture a substrate cleaning tool containing abrasive grains inside thereof.

Figure 8:
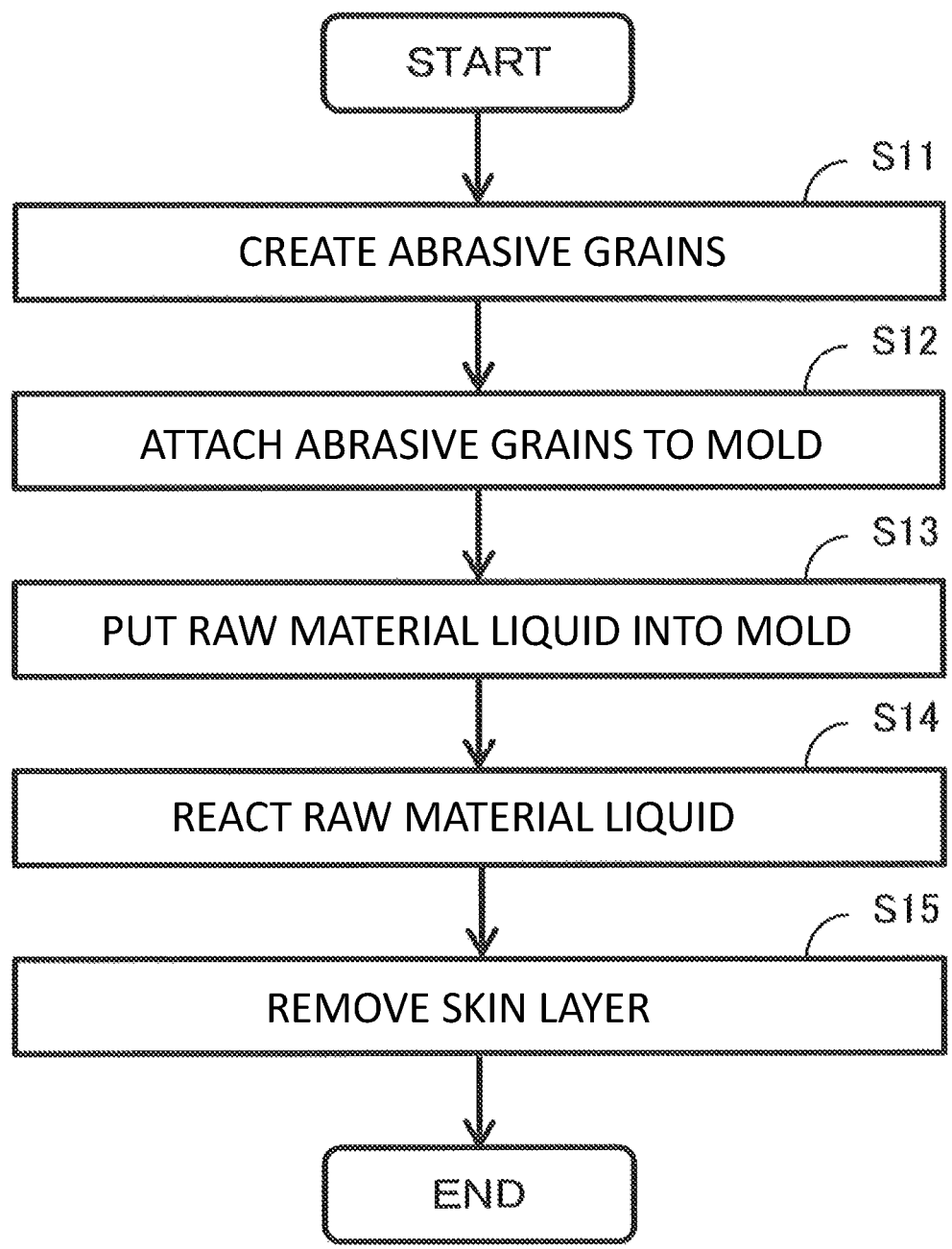
FIG. 8 is a manufacturing flowchart of a substrate cleaning tool containing fine abrasive grains on its surface.

FIG. 8 is a manufacturing flowchart of a substrate cleaning tool containing abrasive grains at a high dispersion rate, in particular, in its surface.

First, fine abrasive grains are created by causing large abrasive grains to be hit together and crushed by a known method (step S11).

Next, the created abrasive grains are attached to an inner surface of the mold (step S12). At this time, by uniformly attaching the abrasive grains to the mold, it is possible to manufacture a substrate cleaning tool where distribution density of the abrasive grains is uniform. Alternatively, by attaching a large amount of abrasive grains to a part of the mold (for example, a central part of the mold) and attaching a small amount of abrasive grains to another part of the mold (for example, a part away from the center of the mold), it is possible to manufacture a substrate cleaning tool where distribution density of the abrasive grains varies depending on position. A method of attaching the abrasive grains to inner wall of the mold may be a method of immersing the mold into a coating liquid where abrasive grains are dispersed in a dispersion liquid and then disposing of the coating liquid, or may be a method of coating the inner wall of the mold with the coating liquid by a spray.

Figure 9:
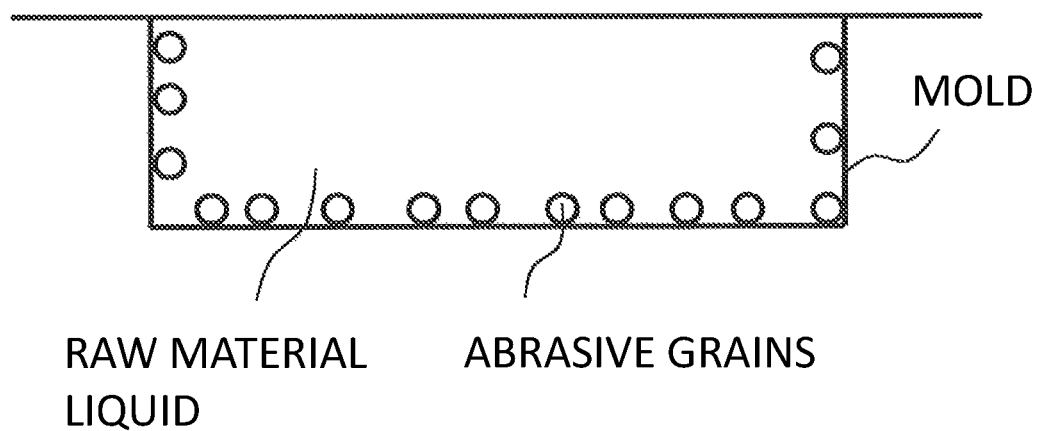
FIG. 9 is a view schematically showing a state where raw material liquid of PVA sponge is put into a mold with fine abrasive grains being attached to a surface of the mold.

Then, a raw material liquid of PVA sponge where an acetalizing agent (for example, aldehydes such as formaldehyde), a reaction catalyst (for example, mineral acid such as sulfuric acid or hydrochloric acid), and a pore making agent (for example, starch) are blended into a PVA solution is put into the mold to which the abrasive grains are attached (step S13, see FIG. 9).

Thereafter, the raw material liquid is reacted at 40 to 100° C. for 5 to 20 hours in the mold (step S14). In this case, the raw material liquid may be reacted while the mold is rotated. After the reaction, redundant acetalizing agent, reaction catalyst, and pore making agent are cleaned and removed. Thereafter, the skin layer is removed as needed (step S15).

Thereby, it is possible to manufacture a substrate cleaning tool containing fine abrasive grains in a surface thereof. In step S13, the abrasive grains may be further put into the mold by further mixing the abrasive grains into the raw material liquid in advance or further putting the abrasive grains into the mold after putting the raw material liquid into the mold.

According to the manufacturing flowchart shown in FIG. 8, the raw material liquid (or a mixture of the raw material liquid and the abrasive grains) is put into the mold after attaching the abrasive grains to the inner wall of the mold in advance, it is possible to obtain a PVA sponge where a dispersion rate of the abrasive grains in an outer portion of the sponge is higher than that in an inner portion of the sponge. Thereby, it is possible to efficiently increase the number of abrasive grains that affect the substrate during cleaning of the substrate W and the like. The dispersion liquid for attaching the abrasive grains to inner wall of the mold may be the same as the raw material liquid of PVA sponge or may be different from the raw material liquid of PVA sponge. The dispersion liquid may be the same as the raw material liquid of PVA sponge, and a content ratio of the abrasive grains of the dispersion liquid may be higher than a ratio between a raw material liquid and abrasive grains put into the mold later.

As described above, the substrate cleaning tool according to the first embodiment is a substrate cleaning tool made of PVA sponge containing abrasive grains. The cleaning power is improved by the substrate cleaning tool as described above.

Second Embodiment

A substrate cleaning tool according to a second embodiment is a substrate cleaning tool made of PVA sponge containing fluororesin particles instead of the abrasive grains in the first embodiment. The fluororesin may be PTFE (Poly Tetra Fluoro Ethylene), PCTFE (Poly Chloro Tri Furuoro Ethylene), PFA (Per Fluoroalkoxy Alkane), PVDF (Poly Vinylidene DiFluoride), or ETFE (Ethylene Tetra Fluoro Ethylene), whose chemical resistance is high. Further, the fluororesin particles may be conductive fluororesin particles. As a specific example, the conductive fluororesin particles may be the above fluororesin into which carbon nanotubes are mixed. The average particle diameter of the fluororesin particles is, for example, 500 µm or less, and is desired to be 10 µm or less. The others are the same as those of the first embodiment.

The substrate cleaning tool contains the fluororesin particles, so that while improving the cleaning power, it is possible to suppress damage applied to the cleaning because of low hardness of the fluororesin particles as compared with the abrasive grains. Further, the substrate cleaning tool contains conductive fluororesin particles, so that it is possible to prevent an object to be cleaned from being charged with static electricity. The substrate cleaning tool as described above can be manufactured through the manufacturing process shown in FIG. 6 or FIG. 8 (however, steps S1 and S11 may be omitted).

Third Embodiment

A substrate cleaning tool according to the third embodiment is a substrate cleaning tool made of PVA sponge containing catalyst particles instead of the abrasive grains in the first embodiment. The catalyst particles may be catalyst metal particles. As specific examples, the catalyst particles may be particles of Pd, Ni, Pt, Fe, Co, Au, or an alloy of these metals. The particle diameters of the catalyst particles are not limited. The others are the same as those of the first embodiment.

In the substrate cleaning tool containing the catalyst metal, in the presence of cleaning liquid, reactive species with a substrate surface are generated from the cleaning liquid only in the vicinity of catalyst material, and the substrate is cleaned by a liftoff operation of the reactive species. According to the PVA sponge containing the catalyst metal particles of the present embodiment, cleaning can be performed without generating excessive etching on the substrate surface.

The substrate cleaning tools in the second embodiment and the third embodiment can be manufactured through the manufacturing processes of FIG. 6 and FIG. 8, respectively. However, in steps S1 and S11, particles corresponding to each substrate cleaning tool are prepared.

Each of the substrate cleaning tools in the first embodiment, the second embodiment, and the third embodiment can be used as, for example, the substrate cleaning tools used in the substrate cleaning apparatuses of FIGS. 1 to 4B.

As the cleaning liquid, for example, it is possible to use an etching cleaning liquid based on hydrofluoric acid, an acidic cleaning liquid, an alkaline cleaning liquid, a cleaning liquid containing a surface active agent and/or a chelate agent, or a cleaning liquid where components of these liquids are mixed.

The first to the third embodiments may be combined, and the substrate cleaning tool may be made of PVA sponge and may contain the particles of two or more of the abrasive grains, the fluororesin, and the catalyst. The material and the structure of the substrate cleaning tool are not particularly limited. For example, the substrate cleaning tool is made of not only PVA, but also other resin materials (for example, polyurethane, foamed polyurethane, epoxy resin, PET (Poly Ethylene Terephthalate), and Teflon (registered trademark)). The substrate cleaning tool may have a pad structure harder than a sponge structure.

A cleaning tool having a pad structure can be applied to, for example, buff-cleaning of a substrate. The buff-cleaning is finishing processing that causes a substrate and a cleaning tool having a pad structure to move relative to each other while causing the cleaning tool to come into contact with the substrate, removes foreign objects on the substrate, and improves a processing surface. The cleaning tool having such a pad structure may be made of foamed polyurethane or may be a suede type tool or a non-woven cloth, and at least one type of the particles of the abrasive grains, the fluororesin, and the catalyst is contained in the cleaning tool. The cleaning tool having a pad structure is harder than sponge, so that it is possible to increase physical cleaning power for the substrate.

Further, one of the spindles (substrate holding rotating mechanisms) of the substrate cleaning apparatus shown in FIG. 1 and the like may be replaced with an edge cleaner containing abrasive grains or the like. In other words, the substrate cleaning apparatus includes at least one substrate holding roller and at least one edge cleaner. The substrate holding roller has a rotation drive force and not only holds the substrate, but also rotates the substrate. The edge cleaner comes into contact with an edge of the substrate. The contact portion contains particles of the abrasive grains, the fluororesin, or the catalyst. The edge cleaner may only simply come into contact with the edge of the substrate or may rotate the substrate. During the cleaning, a controller performs control so that the substrate holding roller holds the substrate and the edge cleaner comes into contact with a substrate to be processed.

Although a normal substrate holding roller does not have substrate cleaning capability, if the edge cleaner contains, for example, fluororesin particles, an electrostatic charging suppression effect and a cleaning effect are expected.

The above embodiments are described so that a person with an ordinary skill in the technical field to which the invention pertains can implement the invention. Various modified examples of the above embodiments can be naturally made by those skilled in the art, and the technical idea of the invention can be applied to other embodiments. Therefore, the invention is not limited to the described embodiments and should encompass the widest range in accordance with the technical ideas defined by the claims.

REFERENCE SIGNS LIST 1a, 1b, 1c substrate cleaning apparatus
2 spindle
2a piece
3 cleaning mechanism
31 pen type cleaning tool
32 arm
33 moving mechanism
34 cleaning liquid nozzle
35 rinse liquid nozzle
36, 37 roll type cleaning tool
38 bevel cleaning tool

What is claimed is:

1. A substrate cleaning apparatus comprising:
a spindle configured to hold and rotate a substrate to be processed; and
a first substrate cleaning tool and a second substrate cleaning tool each configured to come into contact with the substrate to be processed and clean the substrate, each of the first substrate cleaning tool and the second substrate cleaning tool comprising:
a plurality of large diameter portions and a plurality of small diameter portions, the large diameter portions being larger than the small diameter portions,
wherein the large diameter portions and the small diameter portions are alternately arranged in a longitudinal direction,
wherein at least the large diameter portions provide a substantially continuous contact surface across a longitudinal direction or around a circumferential direction of the cleaning tool,
at least one of the first cleaning tool or the second cleaning tool comprises a resin material where at least a portion in contact with a substrate to be processed contains fluororesin particles, and
wherein the first cleaning tool and the second cleaning tool are further arranged such that the large diameter portions of the first cleaning tool and the small diameter portions of the second cleaning tool are configured to engage with each other when the substrate to be processed is being processed.

2. The substrate cleaning tool according to claim 1, further comprising:
at least a first region of the portion in contact with the substrate to be processed; and
a second region of the portion in contact with the substrate to be processed,
wherein a distribution density of the fluororesin particles varies between the first region and the second region.

3. The substrate cleaning tool according to claim 1, wherein the fluororesin particles are contained in a surface of the substrate cleaning tool.

4. The substrate cleaning tool according to claim 1, wherein the fluororesin particles are a conductive resin.

5. The substrate cleaning tool according to claim 1, wherein the fluororesin particles are a resin containing carbon nanotubes.

6. The substrate cleaning apparatus according to claim 1, wherein the substrate cleaning tool cleans a bevel or a back surface of the rotated substrate to be processed.

7. The substrate cleaning apparatus according to claim 1, wherein the first cleaning tool and the second cleaning tool are arranged so as not to be in contact with each other.

8. The substrate cleaning apparatus according to claim 1, wherein the first cleaning tool and the second cleaning tool are arranged such that a bevel and an edge of the substrate to be processed is inserted between the first cleaning tool and the second cleaning tool, and
wherein the first cleaning tool and the second cleaning tool are configured to be swingable in a direction parallel to the surface of the substrate to be processed.

\* \* \* \* \*